United States Patent
Kitabatake et al.

(10) Patent No.: US 7,230,273 B2
(45) Date of Patent: Jun. 12, 2007

(54) SEMICONDUCTOR DEVICE WITH A PLURALITY OF SEMICONDUCTOR ELEMENTS EACH INCLUDING A WIDE BAND-GAP SEMICONDUCTOR

(75) Inventors: Makoto Kitabatake, Nara (JP); Osamu Kusumoto, Nara (JP); Masao Uchida, Ibaraki (JP); Kunimasa Takahashi, Ibaraki (JP); Kenya Yamashita, Kadoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 166 days.

(21) Appl. No.: 10/494,613

(22) PCT Filed: Jun. 13, 2003

(86) PCT No.: PCT/JP03/07585

§ 371 (c)(1),
(2), (4) Date: May 4, 2004

(87) PCT Pub. No.: WO03/107422

PCT Pub. Date: Dec. 24, 2003

(65) Prior Publication Data

US 2004/0248330 A1    Dec. 9, 2004

(30) Foreign Application Priority Data

Jun. 13, 2002  (JP) ............................ 2002-172317
Jan. 27, 2003  (JP) ............................ 2003-017391

(51) Int. Cl.
H01L 29/00   (2006.01)
H01L 29/12   (2006.01)

(52) U.S. Cl. .................. 257/76; 257/77; 257/E27.001
(58) Field of Classification Search .................. 438/17; 257/48, 76, 77
See application file for complete search history.

(56) References Cited

U.S. PATENT DOCUMENTS 6,514,779 B1 *  2/2003  Ryu et al. ..................... 438/17

FOREIGN PATENT DOCUMENTS

| JP | 48-101888  | 12/1973 |
| JP | 08-195411  | 7/1996  |
| JP | 2001-53275 | 2/2001  |
| JP | 2002-110727| 4/2002  |

* cited by examiner

Primary Examiner—Evan Pert
(74) Attorney, Agent, or Firm—McDermott Will & Emery LLP

(57) ABSTRACT

A semiconductor module comprises independently operable segments 1 (semiconductor elements) on a SiC substrate. Each segment 1 comprises a source electrode pad 2 and a gate electrode pad 3 both provided to the principal surface side of the SiC substrate, and a drain electrode pad provided on the back surface side of the SiC substrate. The semiconductor module further comprises an isolation region such as a trench or a Schottky diode for electrically isolating the adjacent segments 1 from each other. Only electrode pads 2 and 3 of each of the segments 1 determined as conforming items by a test are connected to electrode terminals 41 and 43, respectively.

9 Claims, 7 Drawing Sheets

SEMICONDUCTOR DEVICE WITH A PLURALITY OF SEMICONDUCTOR ELEMENTS EACH INCLUDING A WIDE BAND-GAP SEMICONDUCTOR

TECHNICAL FIELD

The present invention relates to a semiconductor device comprising many semiconductor elements composed of a wide band-gap semiconductor such as silicon carbide (SiC), GaN, or diamond.

BACKGROUND ART

Conventionally, semiconductor power devices have occupied a large area to control a large current and achieve a low loss. For example, discrete power devices each with many vertical MISFETs integrated on a whole Si wafer with a size of 4 or more inches are commercially available. Each of the vertical MISFETs is a semiconductor element. For example, see the following document: "Power Device/Power IC Handbook", edited by the Research Committee of High-Performance, Sophisticated Power Device/Power IC, the Institute of Electrical Engineers of Japan, published by Corona Publishing Co., Ltd., Jul. 30, 1996, page 4. The reason why one power device is constructed by integrating many vertical MISFETs is that the current flow area of the MISFET is distributed to avoid the localization of a heat-producing part.

On the other hand, wide band-gap semiconductor devices constructed by using a wide band-gap semiconductor such as silicon carbide (SiC), Group-III nitride such as GaN and AlN, or diamond are researched and developed for practical use, because they are expected to provide a high-speed operation, a high breakdown voltage and a low loss in terms of material properties.

Silicon carbide indicated as "SiC" is a material that is distinct in physical and chemical properties from silicon that is indicated as "Si:C" and contains a very small quantity (a few % or less) of C.

PROBLEMS TO BE SOLVED

However, it is difficult to obtain a wafer having a small number of defects for the above-described wide band-gap semiconductor materials.

When, for example, silicon carbide (SiC) is used, a vertical MISFET is formed utilizing as a channel layer a thin film epitaxially grown on a silicon carbide wafer. Such a conventionally used SiC wafer, however, has many defects passing through the SiC wafer that are referred to as micropipes. If defects are inherited from the micropipes into the epitaxially grown thin film and exist in a significant part of a semiconductor element such as a MISFET or a diode, this causes a dielectric breakdown. Consequently, the semiconductor element cannot satisfy its specification for a dielectric breakdown or the like. The micropipe density of a conventionally used SiC wafer is several tens/cm$^2$ or more. Thus, when power devices having an area of 10 mm$^2$ or larger are fabricated, the probable number of micropipes included in each power device is several or more. Therefore, when a SiC device having an area of 10 mm$^2$ or larger, in particular, a power device handling a relatively large current is fabricated on a SiC wafer, a dielectric breakdown is caused in the region of the SiC device where micropipes exist. As a result, the yield of such SiC devices becomes substantially zero.

Wafers of wide band-gap semiconductors other than SiC, such as Group III nitride including GaN and AlN, or diamond, also include various crystal defects at high density. As in the case of the SiC wafer, semiconductor device production using such wafers also leads to reduced yield due to crystal defects.

DISCLOSURE OF INVENTION

It is an object of the present invention to provide a semiconductor device that can ensure a high yield and can be fabricated at low cost while using a wide band-gap semiconductor and a method for fabricating the same.

According to a semiconductor device of the present invention, out of a plurality of independently operable semiconductor elements using a wide band-gap semiconductor layer, only particular semiconductor elements can operate in parallel to each other by electrically connecting electrode pads of each of the particular elements to corresponding electrode terminals.

Thereby, a semiconductor device achieving one function as a whole can be obtained with a high yield in spite of using a wide band-gap semiconductor having many defects.

In particular, a plurality of semiconductor elements may be formed on a common substrate, and the semiconductor elements other than the particular semiconductor elements may not be made to operate. In this case, a semiconductor device can be constructed using only the semiconductor elements determined as conforming items by a test, except those determined as inferior items due to defects. Therefore, a high yield can be realized.

Preferably, the number of the particular semiconductor elements is set at a fixed value.

The semiconductor device may comprise an isolation region serving as a Schottky diode for electrically isolating the plurality of semiconductor elements from one another. In this case, when the semiconductor elements are MISFETs, they can constitute an inverter.

A method for fabricating a semiconductor device of the present invention is a method in which a plurality of independently operable semiconductor elements each having an active region made of a wide band-gap semiconductor are formed, each of electrode pads of each of particular semiconductor elements determined as operating well by a test are connected to a corresponding one of electrode terminals; and the particular semiconductor elements are incorporated into one package.

According to this method, a semiconductor device serving as a power device or the like can be fabricated with a practical yield in spite of using a wide band-gap semiconductor having a high defect rate.

BEST MODE FOR CARRYING OUT THE INVENTION

Figure 1:
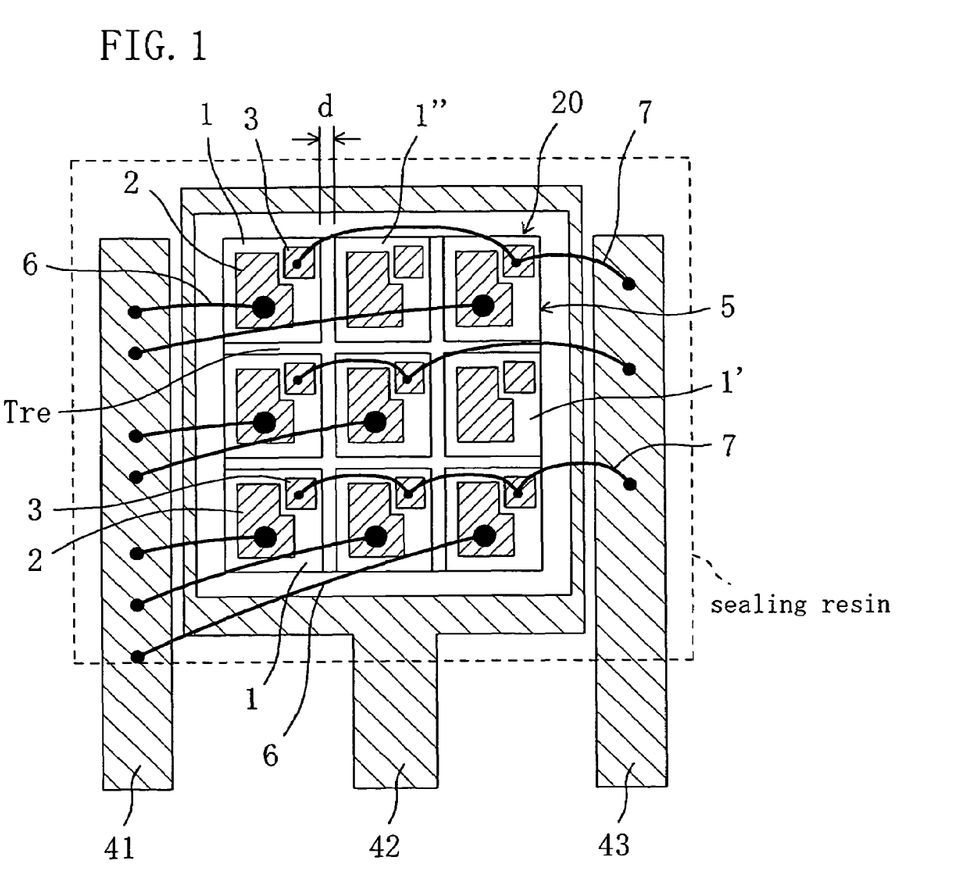
FIG. 1 is a top view showing an essential part of a semiconductor module according to a first embodiment.

FIG. 1 is a top view showing an essential part of a semiconductor module (semiconductor device) according to a first embodiment. As shown in FIG. 1, a semiconductor module of this embodiment comprises a chip 5 formed by providing many (nine in this embodiment) segments 1 (semiconductor elements) having a size of 1.5 mm×1.5 mm (2.25 mm$^2$) on a SiC substrate. Each of the segments 1 comprises a source electrode pad 2 and a gate electrode pad 3 both provided to the principal surface side of the SiC substrate, and a drain electrode pad (not shown) provided on the back surface side of the SiC substrate.

Figure 2:
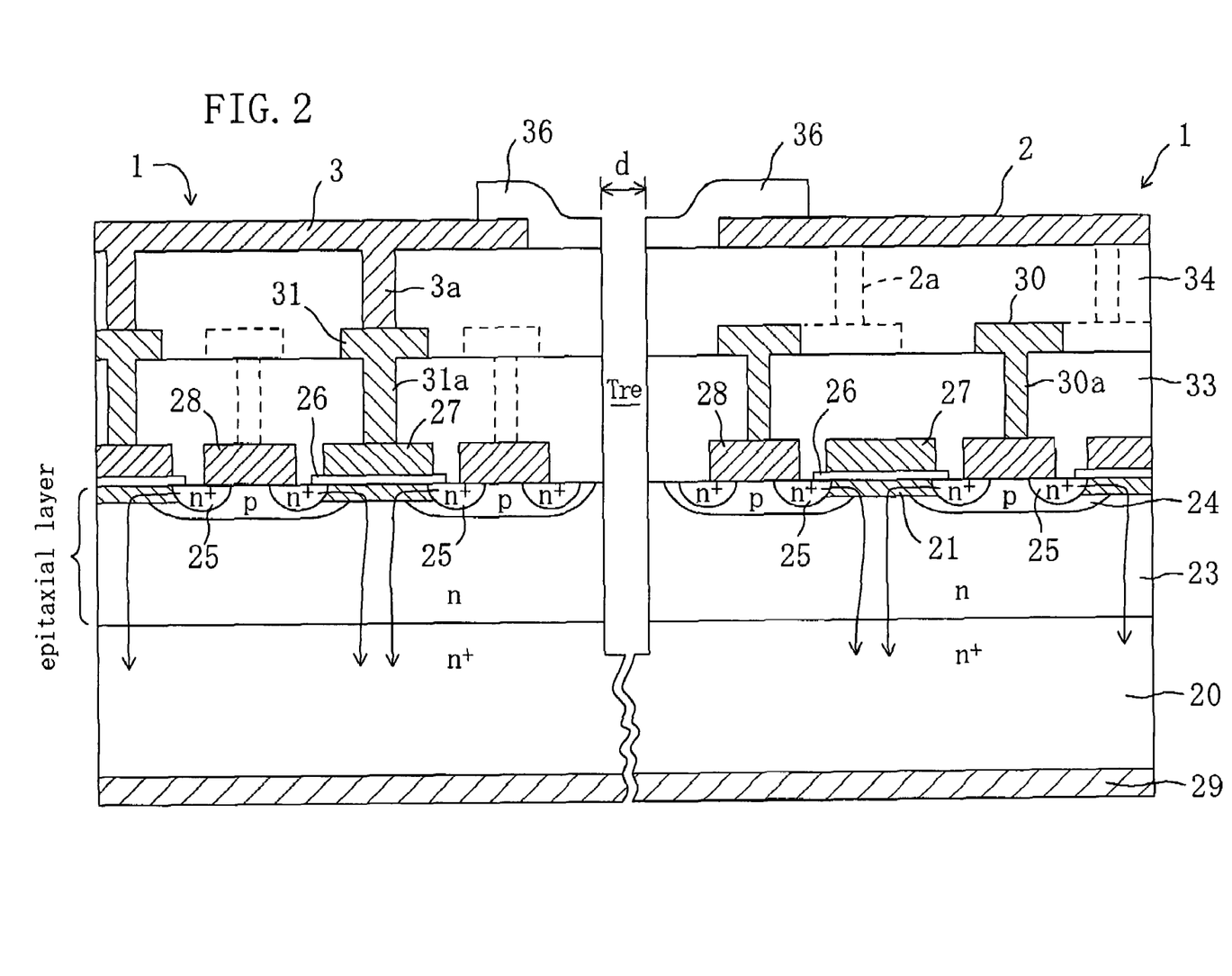
FIG. 2 is a cross sectional view partly showing the structures of adjacent segments of the semiconductor module according to the first embodiment.

Each segment 1 has a current-carrying capacity of 2(A). A current of 2(A) in terms of a direct current flows per segment during operation. As shown in FIG. 2 that will be described later, the adjacent segments 1 are isolated from each other by etching the boundary region between the segments 1 at the principal surface side of a SiC substrate 20 to form a trench Tre and allowing each segment to have a mesa structure. The distance d between the adjacent segments 1 is set at 10 μm or more, thereby ensuring a breakdown voltage of 600V. Hence, a plurality of independently operable segments 1 can be provided on the common SiC substrate 20.

Figure 3:
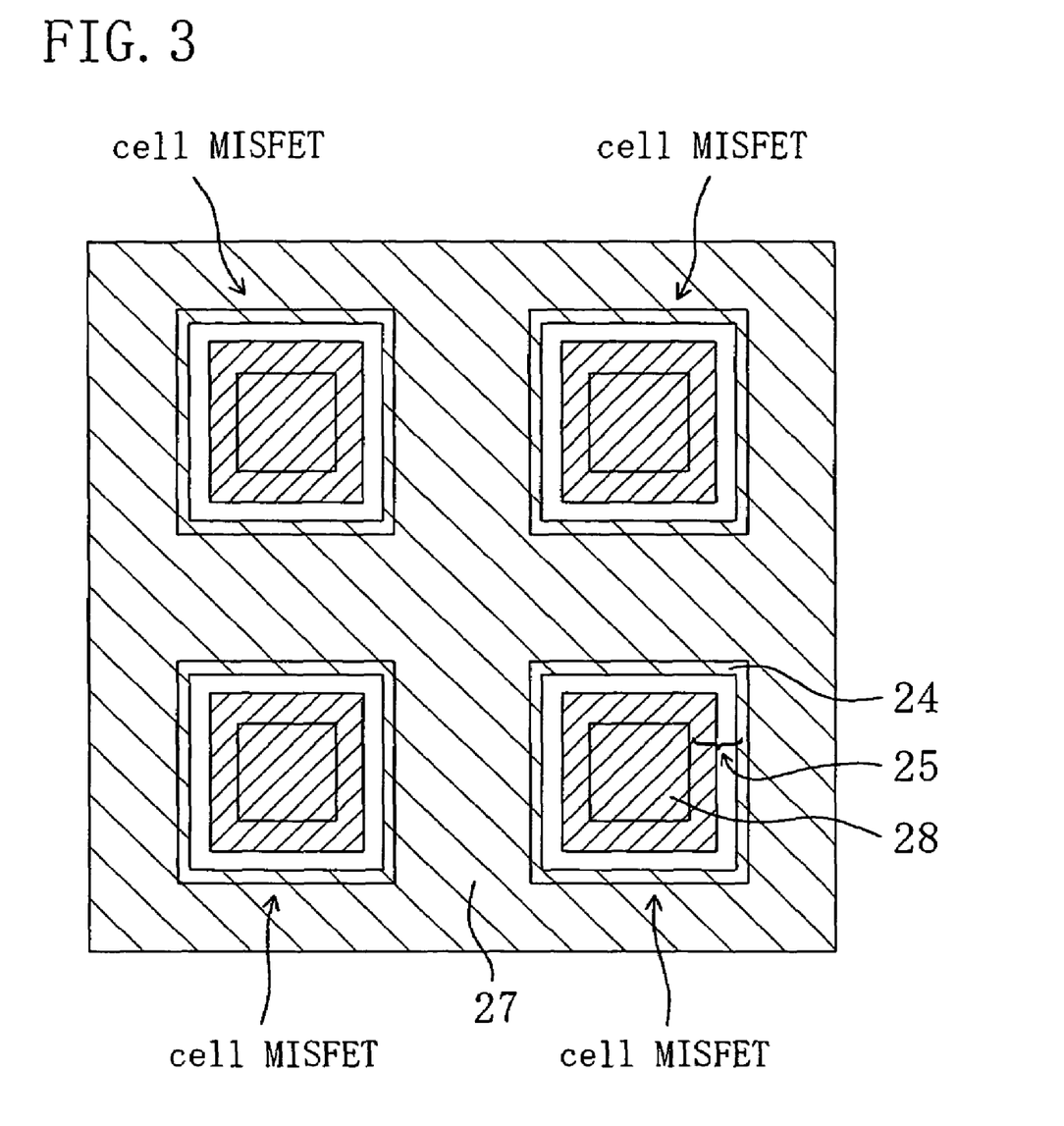
FIG. 3 is a plan view showing the plane shape of part of each segment including a gate electrode, a source electrode, and an impurity diffusion layer in the semiconductor module according to the first embodiment.

FIG. 2 is a cross sectional view partly showing the structures of adjacent segments. FIG. 3 is a plan view showing the plane shape of part of each segment including a gate electrode, a source electrode, and an impurity diffusion layer.

As shown in FIG. 2, the semiconductor module of this embodiment comprises a SiC substrate 20 (6H-SiC substrate) whose principal surface containing n-type impurities at a high concentration is a (0001) off-surface, an n-SiC layer 23 (drift region) that is provided in an epitaxial layer (active region) formed on the SiC substrate 20 and contains n-type impurities at a low concentration, a gate dielectric 26 provided on the epitaxial layer and a gate electrode 27 provided thereon, a source electrode 28 provided on the epitaxial layer to surround the gate electrode 27, a drain electrode 29 provided on the lower surface of the SiC substrate 20, a p-SiC layer 24 formed by doping the region of the epitaxial layer extending from below the source electrode 28 to below the end of the gate electrode 27 with p-type impurities, a source region 25 formed by doping the region of the epitaxial layer extending from below the end of the source electrode 28 to below the end of the gate electrode 27 with n-type impurities at a high concentration, and a channel region 21 formed by introducing n-type impurities at a low concentration into the region of the surface of the epitaxial layer located below the gate electrode 27.

As shown in FIG. 3, the gate electrode 27 is a single continuous member with openings provided at constant intervals both in a longitudinal direction and in a transverse direction. On the other hand, the source electrode 28 comprises many members individually provided in the openings of the gate electrode 27. The source region 25 two-dimensionally surrounds the margin of each of the source electrodes 28 and overlaps with the region of the epitaxial layer located below the gate electrode 27. That is, a cell MISFET is formed in the region of the semiconductor element extending from each of the source regions 25 to a part of the gate electrode 27. The size of one cell MISFET is of the order of a few tens μm$^2$.

A first interlevel dielectric 33 made of a BPSG film, source interconnects 30 and gate interconnects 31 are provided above the epitaxial layer. The source interconnects 30 are connected to the source electrodes 28 via plugs 30a passing through the first interlevel dielectric 33, respectively. The gate interconnects 31 are connected to the gate electrode 27 via plugs 31a passing through the first interlevel dielectric 33, respectively. Furthermore, a second interlevel dielectric 34 made of a BPSG film is provided on the first interlevel dielectric 33. A source electrode pad 2 and a gate electrode pad 3 are formed on the second interlevel dielectric 34. The source electrode pad 2 is connected to the source interconnects 30 via individual plugs 2a passing through the second interlevel dielectric 34. The gate electrode pad 3 is connected to the gate interconnects 31 via individual plugs 3a passing through the second interlevel dielectric 34. The plugs 2a are formed only in the region of the second interlevel dielectric 34 located below the source electrode pad 2 shown in FIG. 1. In this embodiment, the source interconnects 30 connected to all the source electrodes 28 are connected to the source electrode pad 2 via the plugs 2a, respectively. On the other hand, the plugs 3a are formed only below the gate electrode pad 3 shown in FIG. 1, but the gate electrode pad 3 does not have to be connected to all the gate interconnects 31. The reason for this is that the gate electrode 27 is a single continuous member as a whole. A drain electrode pad (drain electrode) 29 is provided on the back surface of the SiC substrate 20 to make ohmic contact with the SiC substrate 20. On the top surface of the chip 5, a passivation film 36 of a silicon nitride film covers the region of the second interlevel dielectric 34 that is not covered with the source electrode pad 2 or the gate electrode pad 3 and the ends of both the source electrode pad 2 and the gate electrode pad 3.

Furthermore, a trench Tre is provided which successively passes through the second interlevel dielectric 34, the first interlevel dielectric 33 and the epitaxial layer and reaches a certain depth of the SiC substrate 20. This trench Tre sections the semiconductor module into nine segments 1.

When each segment 1 of this semiconductor module is to be turned on, a voltage of approximately 5V is applied to the gate electrode 27, the source electrode 28 is grounded, and a voltage of approximately 600V is applied to the drain electrode pad 29. Thus, carriers (in this embodiment, electrons) supplied from the source electrode 28 sequentially flow through the source region 25, the channel region 21, the n-SiC layer 23 and SiC substrate 20, and then reach the drain electrode pad 29.

In the semiconductor device (semiconductor module) of this embodiment, the whole segment 1 operates by a common gate bias and a voltage between the source electrode and the drain electrode to serve as a discrete DMOS device. Furthermore, each segment 1 of this embodiment is a vertical semiconductor element in which carriers move from the principal surface of the SiC substrate to the back surface thereof. It serves as a so-called ACCUFET (Accumulation Mode FET).

This embodiment has the following characteristics: a plurality of segments (semiconductor elements) in the semiconductor module are checked for proper operation, and then the number of the segments to be used (particular semiconductor elements) is set at a fixed value without the use of operationally improper segments. However, a semiconductor device may be constructed using all of the operationally proper segments as the particular semiconductor elements. In an example shown in FIG. 1, the number of the segments that are the particular semiconductor elements is restricted to seven. An operationally improper segment 1' and an operationally proper but redundant segment 1" are not used. Therefore, as shown in FIG. 1, although the common drain electrode pad 29 for the segments 1, 1' and 1" is connected to a drain electrode terminal 42 by die bonding, wire bonding is performed for only seven operationally proper segments 1 but not performed for the segments 1' and 1". That is, only the source electrode pad 2 of each segment 1 is connected via a 0.3 mmφ wire 6 (made of aluminum) to a source electrode terminal 41, and only the gate electrode pad 3 of each segment 1 is connected via a 0.25 mmφ wire 7 (made of aluminum) to a gate electrode terminal 43. These members are encapsulated in a sealing resin shown by the broken line in FIG. 1 and are incorporated into one package.

However, unless at least one of the electrode pads 2, 3 and 29 of each of the semiconductor elements (segments 1' and 1" in this embodiment) other than the particular semiconductor elements is connected to the electrode terminals 41, 42 or 43, the semiconductor elements (segments) do not operate. Thus, the effect of the present invention can be achieved.

Figure 4A:
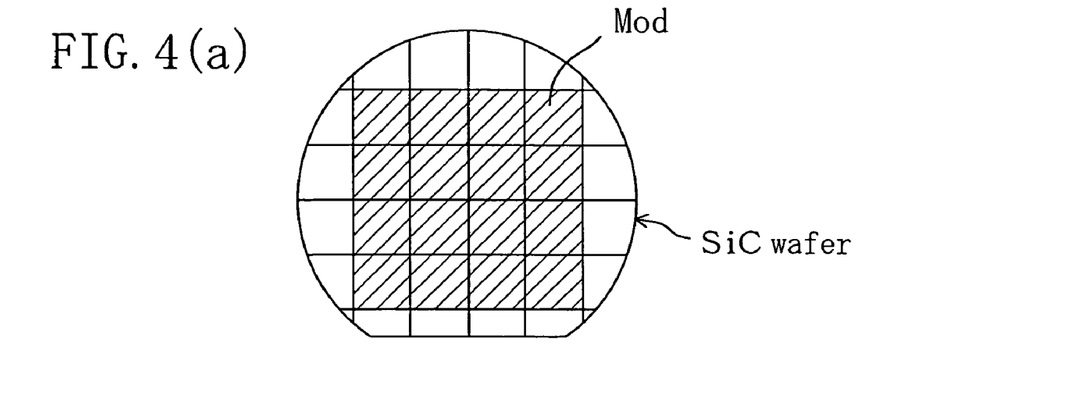
FIGS. 4(a) through 4(c) are plan views showing process steps for fabricating the semiconductor module according to the first embodiment.
Figure 4B:
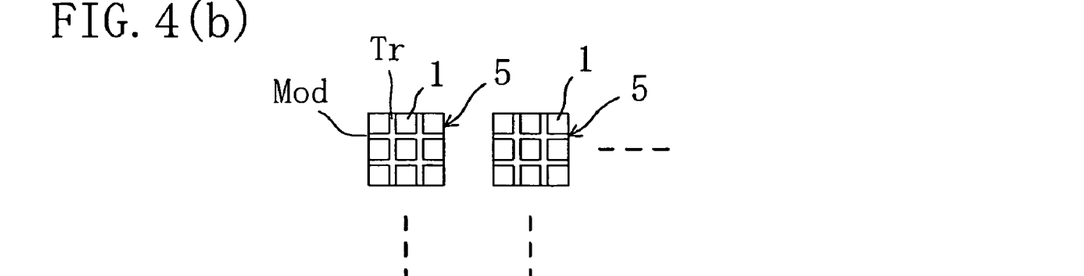
Figure 4C:
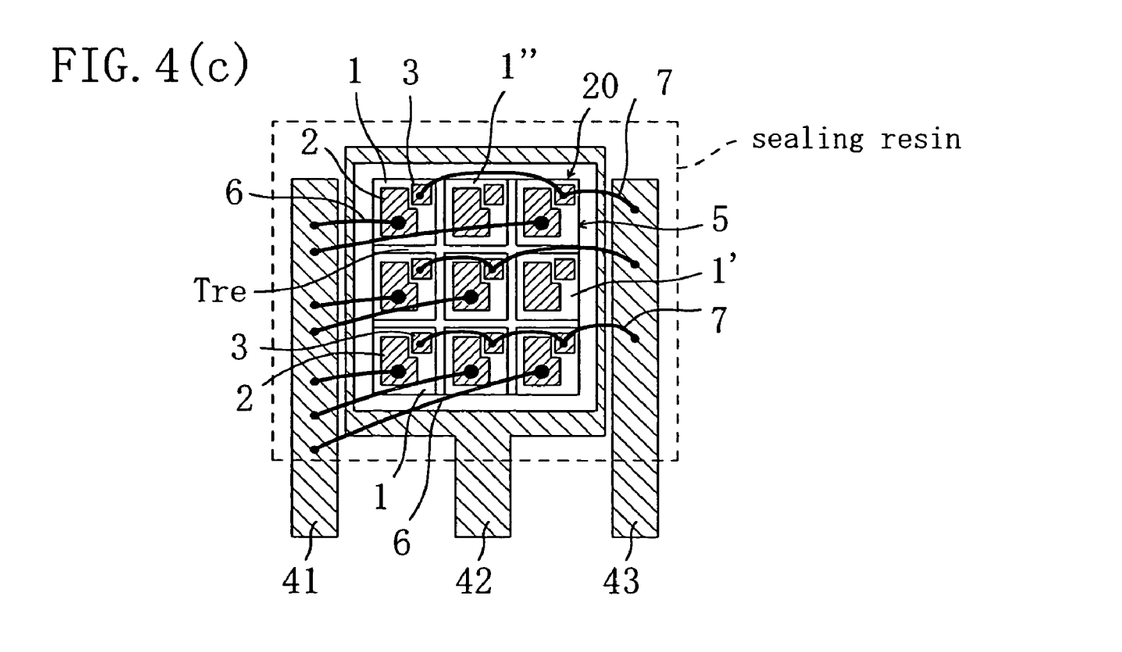

FIGS. 4(a) through 4(c) are plan views showing process steps for fabricating the semiconductor module according to this embodiment.

First, in a process step shown in FIG. 4(a), cell MISFETs having a structure shown in FIGS. 2 and 3 are formed in many module regions Mod of a SiC wafer having a diameter of 2 inches. Although not shown in FIG. 4(a), at this point of time, each of the module regions Mod is partitioned into many segments 1 (nine segments in this embodiment) by a trench Tre.

Next, in a process step shown in FIG. 4(b), the module regions Mod each including 3×3=9 segments are cut out of the SiC wafer as individual chips 5 by dicing. The operation of each segment 1 is checked for each of the chips 5. Consequently, it is determined that one segment that does not operate is included in the nine segments 1. It is considered that this malfunction is caused by micropipes included in the substrate.

Next, in a process step shown in FIG. 4(c), a drain electrode pad 29 of the chip 5 is die-bonded on a drain electrode terminal 42. Wire bonding is not performed on an operationally improper segment 1' and an operationally proper but redundant segment 1". While the segments 1' and 1" are left without being hardwired, only the remaining seven segments 1 are hardwired. Then, the chip 5 is packaged as a power device. In this case, for its segments 1, their source electrode pads 2 are one by one bonded directly to the source electrode terminal 41 by using a single 0.3 mmφ wire 6 (made of aluminum). The gate electrode pads 3 of a plurality of segments 1 that are placed in the same row are connected in series by using a 0.25 mmφ wire 7 (made of aluminum), and one of them is bonded to the gate electrode terminal 43 by using a 0.25 mmφ wire 7 (made of aluminum).

Thereafter, these members are encapsulated in a sealing resin for general purpose use (see the broken line shown in FIG. 4(c)) with the ends of the source electrode terminal 41, the drain electrode terminal 42 and the gate electrode terminal 43 exposed. As a result, a semiconductor device (semiconductor module) is completed as a resin-encapsulated package.

The semiconductor module of this embodiment has a power rating of 15(A), serves as a power device having a breakdown voltage of 600V, and allows a current to flow such that a plurality of MISFETs (segments) operate in parallel. It is recognized that in this module, the operation of each MISFET is steady without the concentration of current on a particular MISFET. From among a plurality of MISFETs formed on the common SiC substrate, only operationally proper MISFETs are selected by a characteristic test and wire bonded. Therefore, a semiconductor module can be obtained which can be fabricated at low cost while ensuring a high yield, in spite of using a wide band-gap semiconductor.

When one of the bonded segments was broken down and an overcurrent exceeding 30(A) temporarily flowed, the 0.3 mmφ wire 6 served as a fuse member and was blown out. As a result, no overcurrent kept flowing. Therefore, the semiconductor module of this embodiment was proven to have a fail-safe reliability.

According to this embodiment, in the semiconductor module (semiconductor device) provided as a single resin-encapsulated package, the operationally improper segment 1' of the plurality of segments 1, 1' and 1" (semiconductor elements) is not wire-bonded to the terminal so as not to be used. Therefore, only a plurality of segments 1 (particular semiconductor elements) of excellent electrical characteristics having no crystal defect such as micropipes are operated in parallel, whereby the semiconductor module can serve as a single power device. Consequently, in spite of using a wide band-gap semiconductor, a semiconductor module that controls a large current and achieves a low loss can be fabricated at low cost while ensuring a high yield.

When, for example, the wafer has a micropipe density of 10 per cm$^2$, the probable number of micropipes included in the resulting semiconductor device (semiconductor module) having an area of approximately 100 mm$^2$ is ten. Consequently, in such a case, a high yield cannot be expected. Even for a wafer of the same micropipe density, however, when the semiconductor module is partitioned into small-area segments and formed of one-hundred independently operable segments each having an area of 1 mm$^2$, only ten of the one-hundred segments will include micropipes while the remaining ninety segments will normally operate. Therefore, the yield of semiconductor modules can be kept high.

Furthermore, the number of segments (particular semiconductor elements) to be actually used is set at a predetermined number (for example, eighty-five) that is smaller than ninety. That is, the number of segments to be used is smaller than the average number of non-defective segments that is expected from the empirically known average density of defects. As a result, the yield can be further improved. In this case, segments that are conforming items yet not used may decrease the total yield of segments. However, it will suffice if in consideration of this, the number of segments to be used is the number allowing the highest yield to be empirically obtained.

In this embodiment, there is described a case where the trench Tre (isolation region) formed by etching allows each segment to have a mesa structure, whereby the segments are blocked from electrically interfering with one another and can independently operate. However, this is not restrictive, but the configuration that blocks the segments 1 from electrically interfering with one another may be implemented as by a guard ring composed of a p-type region formed by ion implantation.

In this embodiment, the segments 1 are formed on the common SiC substrate 20 and are not physically separated from one another. However, the SiC wafer may be divided into segments 1 in the process step shown in FIG. 4(b), only proper segments 1 obtained as a test result may be selected, and then in the process step shown in FIG. 4(c), the proper segments may be die-bonded on the common drain electrode terminal.

Individual cell MISFETs can be checked for proper operation instead of checking on a segment-by-segment basis. Then, operationally improper cell MISFETs and redundant source interconnects can be cut by laser or the like (fuse wiring). For example, the individual cell MISFETs can be checked for operation by applying a test voltage from the gate interconnect 28, the source interconnect 30 and the drain electrode pad 29 to each cell MISFET before the formation of the second interlevel dielectric 34 shown in FIG. 2. Thereafter, source interconnects 30 of both the operationally improper cell MISFETs and redundant cell MISFETs can be cut by laser or the like. In this case, the chip 5 does not have to be partitioned into a plurality of segments, and therefore the trench Tre does not have to be formed. Since the trench Tre is unnecessary, the whole chip 5 can be downsized as compared with the above-described embodiment. In this case, the cell MISFETs in which the source interconnect is connected to the source electrode pad are the particular semiconductor elements.

Each segment of the semiconductor module of the present invention does not necessarily have to be a MISFET serving as an ACCUFET as in this embodiment. For example, it may be a MISFET having a structure shown in FIGS. 9(a), 9(b) and 10 of International Patent Application No. PCT/JP01/07810, or may be a MISFET having a structure in which a trench formed in an epitaxial layer is filled with a gate dielectric and a gate electrode.

Second Embodiment

Figure 5A:
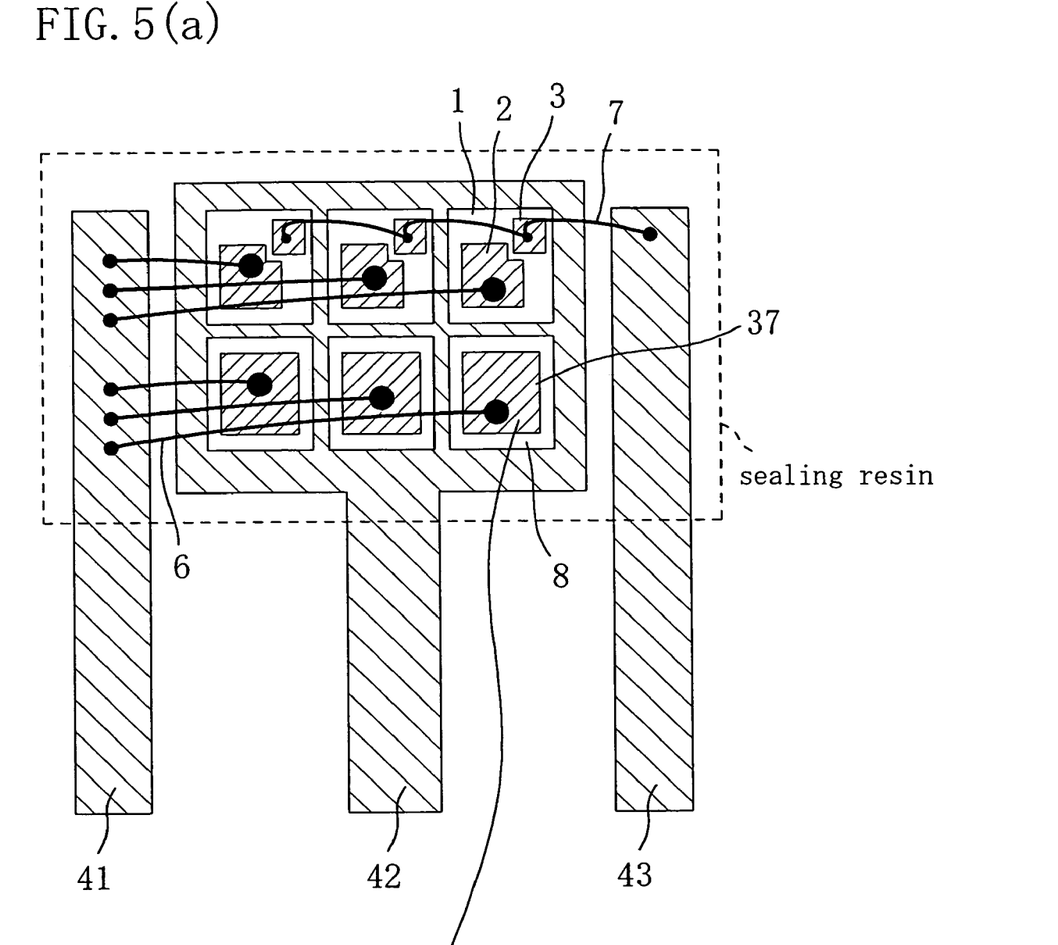
FIGS. 5(a) and 5(b) are a top view showing an essential part of a semiconductor module according to a second embodiment and a cross sectional view of a Schottky diode located in the semiconductor module, respectively.
Figure 5B:
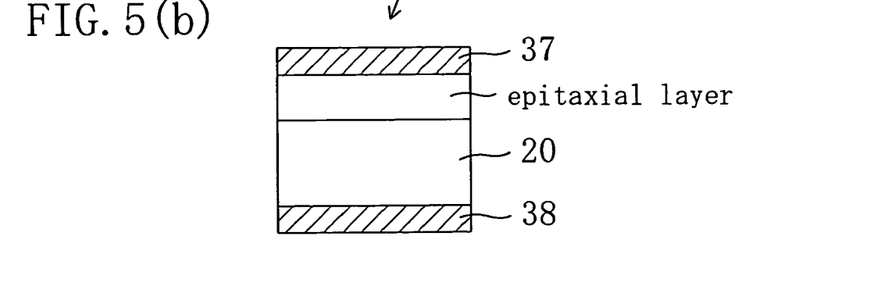

FIGS. 5(a) and 5(b) are a top view showing an essential part of a semiconductor module (semiconductor device) according to a second embodiment and a cross sectional view of a Schottky diode located in the semiconductor module, respectively.

As shown in FIGS. 5(a) and 5(b), a semiconductor module of this embodiment comprises three segments 1 serving as MISFETs having a size of 2 mm×2 mm (4 mm$^2$) and three segments 8 serving as Schottky diodes having a size of 2 mm×2 mm (4 mm$^2$), each formed on a SiC substrate. In this embodiment, all of the three segments 1 (MISFETs) and the three Schottky diodes (segments 8) are particular semiconductor elements. Each of the segments 1 serving as MISFETs comprises a source electrode pad 2 and a gate electrode pad 3 provided to the principal surface side of the SiC substrate, and a drain electrode pad (not shown) provided on the back surface side of the SiC substrate. As shown in FIG. 5(b), each of the segments 8 serving as Schottky diodes comprises an epitaxial layer provided on a SiC substrate 20 and containing n-type impurities at a low concentration, a Schottky electrode pad 37 making Schottky contact with the top surface of the epitaxial layer, and an ohmic electrode pad 38 making ohmic contact with the back surface of the SiC substrate 20. The structure of each segment 1 serving as a MISFET is as shown in FIGS. 2 and 3. Each segment 1 serving as a MISFET has a current-carrying capacity of 10(A). A current of 10(A) in terms of a direct current flows per segment during operation. Each segment 8 serving as a Schottky diode has a current-carrying capacity of 10(A). A current of 10(A) in terms of a direct current flows per segment during operation.

In this embodiment, wafers of one kind are formed with only many segments 1 serving as MISFETs, and wafers of another kind are formed with only many segments 8 serving as Schottky diodes. Each of the segments 1 and 8 is subjected to a characteristic test as each of them still constitutes a wafer. Thereafter, dicing is performed for each of wafers including the segments 1 and wafers including the segments 8 so that each chip is cut out to include one segment 1 or 8. Then, three chips including operationally proper segments 1 and three chips including operationally proper segments 8 are mounted on a drain electrode terminal 42 by die bonding as shown in FIG. 5. For each segment 1, a 0.3 mmφ wire 6 (made of aluminum) is directly bonded to the source electrode pad 2 and the source electrode terminal 41 to connect them. Likewise, for each segment 8, a 0.3 mmφ wire 6 (made of aluminum) is directly bonded to the Schottky electrode pad 37 and the source electrode terminal 41 to connect them. The gate electrode pads 3 of a plurality of segments 1 placed in the same row are connected in series via a 0.25 mmφ wire 7 (made of aluminum). Furthermore, the gate electrode pad 3 of the segment 1 closest to the gate electrode terminal 43 is connected via the wire 7 to the gate electrode terminal 43. Furthermore, these members are encapsulated in a sealing resin for general purpose use (see the broken line shown in FIG. 5(a)) with the ends of the source electrode terminal 41, the drain electrode terminal 42 and the gate electrode terminal 43 exposed. As a result, a semiconductor module is provided as a resin-encapsulated package.

The semiconductor module (power module) of this embodiment has a current rating of 30(A), serves as a power module having a breakdown voltage of 600V, and allows a current to flow such that a plurality of MISFETs (segments 1) and Schottky diodes (segments 8) operate in parallel. It is recognized that in this module, the operation of each of the MISFETs and Schottky diodes is steady without the concentration of current on a particular MISFET or Schottky diode. Only the chips that properly operate under a characteristic test are selected from a plurality of MISFETs and Schottky diodes and die-bonded to the drain electrode terminal 42. Therefore, a semiconductor module can be obtained which can be fabricated at low cost while ensuring a high yield, in spite of using a SiC substrate.

When one of the bonded MISFETs (segments 1) and Schottky diodes (segments 8) was broken down and an overcurrent exceeding 30(A) temporarily flowed, the 0.3 mmφ wire 6 served as a fuse member and was blown out. As a result, no overcurrent kept flowing. Therefore, the semiconductor module of this embodiment was proven to have a fail-safe reliability.

Although this embodiment describes a semiconductor module composed of three chips including MISFETs and three chips including Schottky diodes, the number of elements is not restrictive and is appropriately set in accordance with the current rating.

Moreover, in the first and second embodiments, it is preferable that a plurality of segments 1 or 8 are connected to each of the electrode terminals 41, 42 and 43 via a connection member (wire or the like) made of a material that is blown out by the flow of a current exceeding a fixed value. In this case, even when one of the plurality of segments 1 or 8 has shorted out due to a dielectric breakdown or the like, a current exceeding a fixed value blows out the connection member, via which the shorted segment is connected to each of the electrode terminals, thereby interrupting the current. Thus, this connection member serves as a fuse, and the shorted segment enters into an open state so that current no longer flows. Therefore, the overcurrent flowing through the semiconductor module is suppressed, and overcurrent can be prevented from flowing into an equipment body controlled by the semiconductor module. As a result, there can be obtained a highly reliable semiconductor module that satisfies the fail-safe requirement without any adverse affect on the equipment body due to overcurrent. This is significant, for example, for a semiconductor module for use in an inverter for driving a motor of a hybrid electric vehicle (HEV), in which the semiconductor module must control a large current of dozens or greater (A).

Although metals, conductive polymer films or the like are taken as a material that is blown out by the flow of a current exceeding a fixed value, metals are particularly preferable. Mg, Al, Au, Ag, Cu, Pb, and Sn are given as examples of available metals.

In a single semiconductor device, the set of segments 1 and the set of segments 8 may be each continuous, without the segments of each set being cut apart one from another, in a state that the segments 1 or 8 of each set are isolated from one another so as not to electrically interfere with one another. Thus, as in the first embodiment, there exist segments that are not used among each set of the segments 1 or 8. However, this has the advantage that a process for die-bonding each of the segments 1 and 8 to a single drain electrode terminal 42 is simplified.

Third Embodiment

Figure 6:
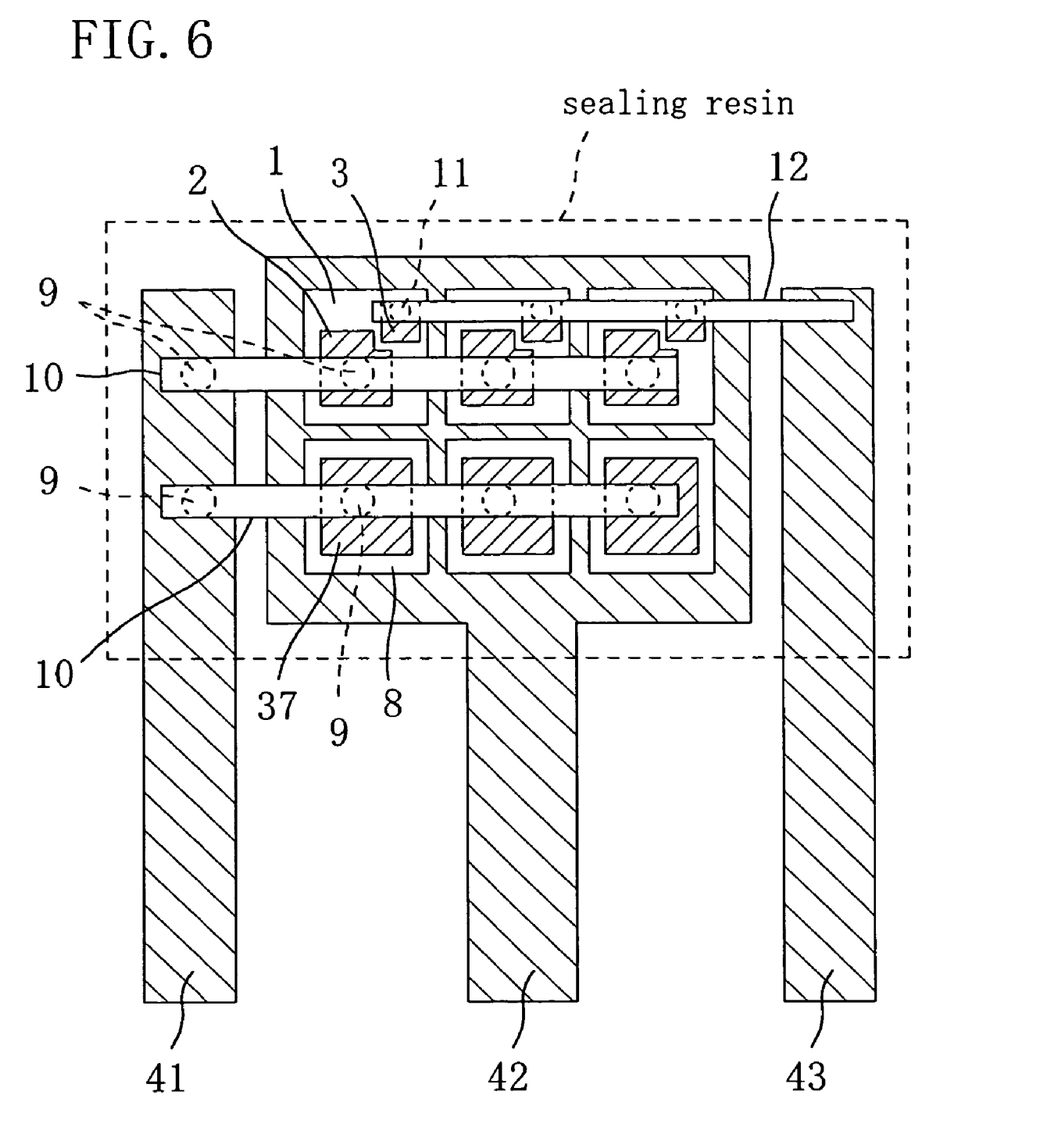
FIG. 6 is a top view showing an essential part of a semiconductor module according to a third embodiment.

FIG. 6 is a top view showing an essential part of a semiconductor module according to a third embodiment.

As shown in FIG. 6, a semiconductor module of this embodiment comprises three segments 1 serving as MISFETs having a size of 2 mm×2 mm (4 mm$^2$) and three segments 8 serving as Schottky diodes having a size of 2 mm×2 mm (4 mm$^2$), each formed on a SiC substrate. Each of the segments 1 serving as MISFETs comprises a source electrode pad 2 and a gate electrode pad 3 provided to the principal surface side of the SiC substrate, and a drain electrode pad (not shown) provided on the back surface side of the SiC substrate. Each of the segments 8 serving as Schottky diodes comprises a Schottky electrode pad 37 making Schottky contact with the top surface of an epitaxial layer, and an ohmic electrode pad 38 making ohmic contact with the back surface of the SiC substrate. The structure of each segment 1 serving as a MISFET is as shown in FIGS. 2 and 3. The structure of each segment 8 serving as a Schottky diode is as shown in FIG. 5(*b*) in the second embodiment. The current-carrying capacity of each of the segments 1 serving as MISFETs and the segments 8 serving as Schottky diodes and the flowing current per segment during operation are the same as in the second embodiment.

The semiconductor module of this embodiment is distinct from that of the second embodiment in that ball bonding, instead of wire bonding, is employed. 0.3 mmφ balls 9 (made of aluminum) are individually placed on the source electrode pads 2 of the segments 1 serving as MISFETs and a source electrode terminal 41. Bonding is carried out by ultrasonic bonding with a metal plate 10 pressed against these balls 9. Likewise, 0.3 mmφ balls 9 (made of aluminum) are individually placed on the Schottky electrode pads 37 of the segments 8 serving as Schottky diodes and a source electrode terminal 41. Bonding is carried out by ultrasonic bonding with a metal plate 10 pressed against these balls 9. Furthermore, 0.25 mmφ balls 11 (made of aluminum) are individually placed on the gate electrode pads 3 of the segments 1 and a gate electrode terminal 43. Bonding is carried out by ultrasonic bonding with a metal plate 12 pressed against these balls 11. Thereafter, these members are encapsulated in a sealing resin (see the broken line shown in FIG. 6) and are incorporated into one package.

The semiconductor module of this embodiment has a current rating of 30(A), serves as a power module having a breakdown voltage of 600V, and allows a current to flow such that a plurality of MISFETs and Schottky diodes operate in parallel. It is recognized that in this module, the operation of each of the MISFETs and Schottky diodes is steady without the concentration of current on a particular MISFET (segment 1) or Schottky diode (segment 8).

As in the second embodiment, from among a plurality of chips including MISFETs (segments 1) and Schottky diodes (segments 2) each formed on a wafer, only the chips including MISFETs and Schottky diodes that properly operate under a characteristic test are selected and die-bonded to a drain electrode terminal 42. Therefore, a semiconductor module can be obtained which can be fabricated at low cost while ensuring a high yield, in spite of using a SiC substrate.

When one of the bonded MISFETs (segments 1) and Schottky diodes (segments 8) was broken down and an overcurrent exceeding 30(A) temporarily flowed, the 0.3 mmφ ball 9 served as a fuse member and was blown out. As a result, no overcurrent kept flowing. Therefore, the semiconductor module of this embodiment was proven to have a fail-safe reliability.

Although metals, conductive polymer films or the like are taken as a material that is blown out by the flow of a current in excess of a fixed value, metals are particularly preferable. Mg, Al, Au, Ag, Cu, Pb, and Sn are given as examples of available metals.

Although in this embodiment a semiconductor module is composed of three segments 1 serving as MISFETs and three segments 8 serving as Schottky diodes, the number of segments per semiconductor module (semiconductor device) is not restrictive and can be appropriately set in accordance with the current rating.

Fourth Embodiment

Figure 7:
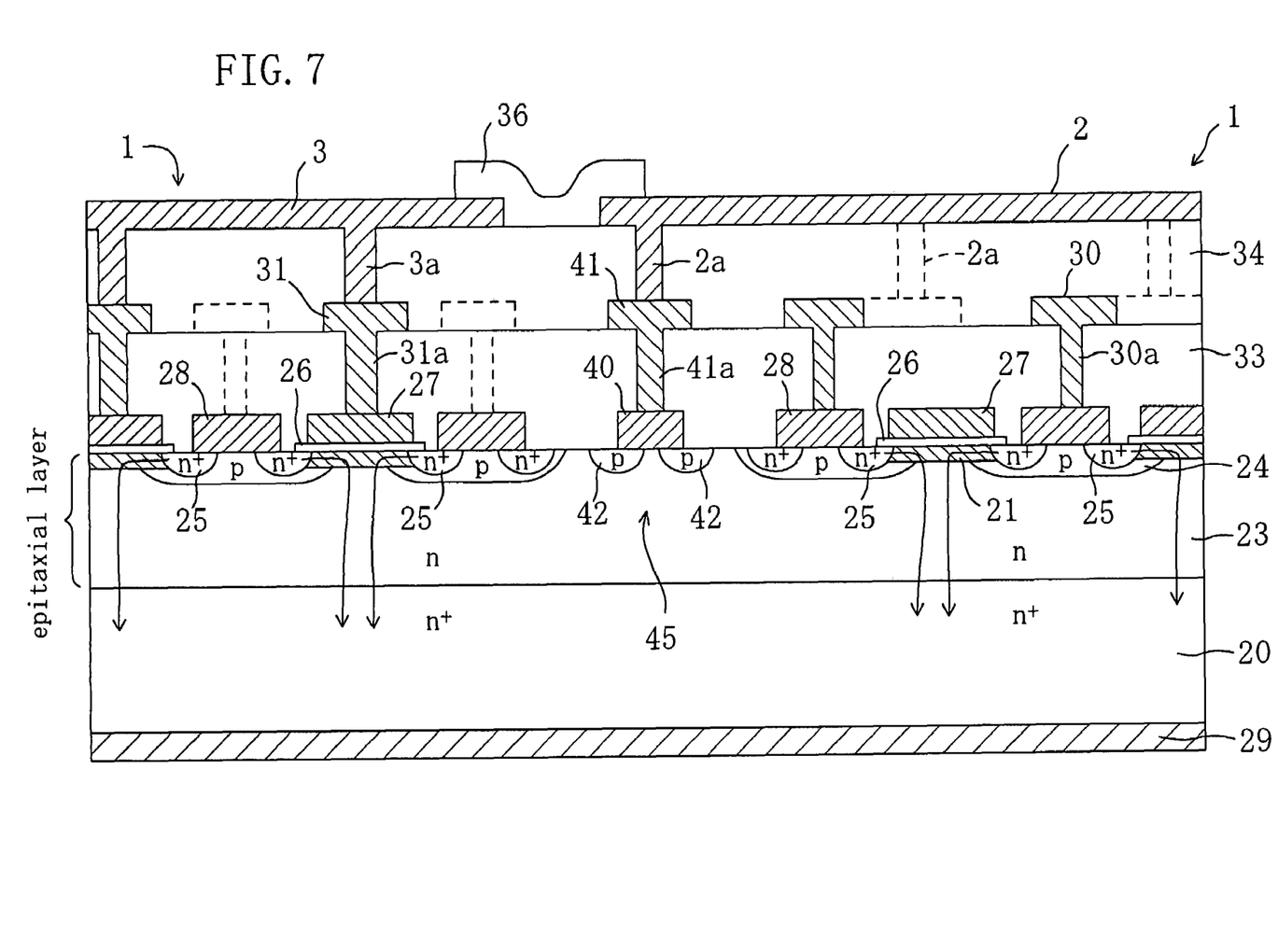
FIG. 7 is a cross sectional view partly showing the structures of adjacent segments of a semiconductor module according to a fourth embodiment.

FIG. 7 is a cross sectional view partly showing the structures of adjacent segments of a semiconductor module (semiconductor device) according to a fourth embodiment. The plane structure of the semiconductor module of this embodiment is basically the same as in FIG. 1.

As shown in FIG. 7, the semiconductor module of this embodiment has segments 1 each having a structure similar to that of the semiconductor module of the first embodiment shown in FIG. 2.

The semiconductor module of this embodiment is characterized in that, unlike the first embodiment, an isolation region is composed of a Schottky diode instead of a trench. Specifically, in this embodiment, the adjacent segments 1 are isolated from each other by forming a region serving as a Schottky diode 45 between the adjacent segments 1, instead of forming a mesa structure by etching.

To be more specific, a Ni film having a width of 100 μm is evaporated along the boundary of each of the segments 1 on the principal surface of a SiC substrate 20 at a 10 μm-spacing away from each segment 1 (MISFET). A Schottky electrode 40 is thereby provided to come into Schottky contact with an epitaxial layer. That is, this Schottky electrode 40 is placed to surround each segment 1 (MISFET). The Schottky diode 45 allows the adjacent segments 1 to be electrically isolated from each other. An insulating diffusion layer 42 containing p-type impurities is provided in each of the regions of the epitaxial layer located below both ends of the Schottky electrode 40.

Also in this embodiment, as in the first embodiment, each segment 1 is constructed by placing a few hundred or more cell MISFETs each having a size of approximately several μm through a few tens μm square in parallel. The source electrode 28 of each of the few hundreds or more cell MISFETs is connected via plugs 30a and 2a and a source interconnect 30 to a source electrode pad 2, and the gate electrode 27 of each of the few hundreds or more cell MISFETs is connected via plugs 31a and 3a and a gate interconnect 31 to a gate electrode pad 3.

A gate interconnect 41 is provided on a first interlevel dielectric 33. The gate interconnect 41 is connected via a plug 41a to the Schottky electrode 40 and is connected via a plug 2a to the source electrode pad 2. That is, the Schottky electrode 40 is electrically connected to the source electrodes 28 located inside each segment 1 (MISFET).

The semiconductor module of this embodiment basically has the similar effects as those of the first embodiment. In addition, since the Schottky electrode 40 and the source electrodes 28 are electrically connected inside each segment 1 serving as a MISFET, each segment 1 (MISFET) is connected in parallel to the Schottky diode 45 in the semiconductor module. Therefore, the semiconductor module can be reduced in size and cost, which is suitable for a module for an inverter. In particular, it is more preferable that an insulating diffusion layer 42 is formed below each of the edges of the Schottky electrode 40, because the dielectric breakdown can be set higher.

When a semiconductor module comprises a plurality of segments 1 (MISFETs) provided on a common substrate (SiC substrate 20) and some segments 1' and 1" (semiconductor elements other than particular semiconductor elements) of the plurality of segments 1 are not electrically connected to the electrode terminals 41 and 43 (see FIG. 1), the region of the substrate serving as a Schottky diode is preferably provided as an isolation region where the segments 1, 1' and 1" are electrically isolated from one another. The reason for this is as follows.

With the above configuration, a depletion layer extends by applying a reverse bias to the region of the substrate serving as a Schottky diode. Therefore, this region serves as an isolation guard ring between the plurality of segments 1 (MISFETs). Furthermore, a semiconductor module can be achieved in which the Schottky diode 45 operable at high speed is mounted in parallel with the MISFETs (segments 1) on a chip. In this manner, it becomes possible that the region of the substrate that has only had the function of ensuring a breakdown voltage of each of the MISFETs (segments 1) as an isolation region also serves as a Schottky diode that operates at high speed without loss of the function of the isolation region.

Thereby, according to the semiconductor module of this embodiment, an isolation region can be formed of a simple structure using an easy process as compared with a mesa structure formed by etching in the first embodiment.

Conventionally, a Si semiconductor module used for an inverter or the like is composed of six units in which power switching elements, such as Insulated Gate Bipolar Transistors (IGBTs) or MISFETs, and diodes are connected in parallel to each other. The motor can efficiently run by switching on the units at their coinciding timing. Since the diode needs to operate at high speed, a high-speed diode called a first recovery diode has been used. In this case, since a semiconductor layer required for the power switching element is significantly distinct from a semiconductor layer required for the first recovery diode in their characteristics such as lifetime, it is difficult to realize a compact module in which the power switching element and the diode are integrated into one chip. Therefore, a conventional module is constructed by assembling different chips.

On the other hand, according to the semiconductor module of this embodiment, a plurality of MISFETs (segments 1) serving as switching elements are integrated with the Schottky diode 45 serving as a high-speed diode on a chip, thereby realizing miniaturization and cost reduction of a module.

This embodiment describes a semiconductor module in the case where wire bonding is used for connection between each of the electrode pads of each segment and the electrode terminal. Ball bonding using metal balls and metal rods may be employed instead, as in the third embodiment.

The appropriate number of the segments in each of the above embodiments will be described hereinafter.

For each of the individually electrically operable segments (semiconductor elements) that are isolated from one another to avoid mutual electrical interference, suppose that the area is given as $C mm^2$, and the density of defects included in the substrate is given as $n/cm^2$. Then, the yield, i.e., the percentage at which the segment (semiconductor element) includes no defect, is expressed by the following formula (1).

$$(100/C-n)/(100/C)=1-n \cdot C/100 \qquad (1)$$

That is, when (100/C) segments (semiconductor elements) are formed per 1 $cm^2$, the probable number of the formed segments including defects, which results in failure, is n. In consideration of a future improvement in the substrate quality of a wafer made of a wide band-gap semiconductor, assume that a defect density of approximately 1/$cm^2$ is achieved. Then, the area of each segment is preferably 50 $mm^2$ or less as seen from the formula (1) for the purpose of ensuring a yield of 50% or more. Likewise, if the defect density is approximately 5/$cm^2$, the area of the semiconductor element is preferably 10 $mm^2$ or less. If the defect density is approximately 10/$cm^2$, the area of the semiconductor element is preferably 5 $mm^2$ or less.

When the area of each segment is smaller than 0.1 $mm^2$, it becomes difficult to perform interconnection such as wire bonding to electrically connect each of the electrode pads to the electrode terminal. Thus, the area of each segment is preferably 0.1 $mm^2$ or larger. Moreover, it is preferable that the area of each segment is 0.4 $mm^2$ or larger, because a wire having a thickness of 0.3 mmφ or more can be bonded so that a larger current is allowed to flow.

Furthermore, the number of segments located in one semiconductor module can be set as suitably as possible also in consideration of the area of the trench or the Schottky diode that is an isolation region.

A current of 100(A) or less in terms of a direct current preferably flows in each segment (semiconductor element) located in the semiconductor module during normal operation. Thus, when a 1 mmφ bonding wire, ball or the like is used as a connection member for electrically connecting each of the electrode pads of the segments to the electrode terminal, the semiconductor module can stably be operated without fusing of the bonding wire, the ball or the like.

When a current exceeding 100(A) flows due to a dielectric breakdown of any one of the segments, the connection member is blown out by serving as a fuse as described above. Moreover, a current of 30(A) or less in terms of a direct current preferably flows in each segment during normal operation, because a 0.3 mmφ bonding wire, ball or the like can be used so that the semiconductor module can be reduced in size. When the current flows into each segment in the form of pulses, it is preferable that a current of 100(A) or less in terms of a direct current keeps flowing therein during the normal operation and that a current exceeding 100(A) does not continuously flow therein for one second or more.

Herein, a "wide band-gap semiconductor" represents a semiconductor in which the energy difference between the lower end of a conduction band and the upper end of a valence band, i.e., a band gap, is 2.0 eV or greater. SiC, Group-III nitride such as GaN and AlN, and diamond are given as examples of such a wide band-gap semiconductor. In particular, when electrical characteristics, the degree of progress toward commercialization and the like are totally taken into account, the wide band-gap semiconductor is preferably SiC for the present.

Various kinds of known semiconductor elements can be used without particular restriction as the segments (semiconductor elements) in the semiconductor module of the present invention. For example, a Schottky diode, a pn diode, a MISFET, a MESFET, a J-FET, a thyristor, or the like can be used.

Furthermore, various kinds of known packages can be used as a package in this invention without particular restriction. For example, a resin-encapsulated package, a ceramic package, a metal package, a glass package, or the like can be used.

In the known semiconductor module using semiconductor elements principally made of Si, a Si wafer has almost no defect. Therefore, a semiconductor element allowing a large current to flow has usually been formed of a large-area element. In a low-dissipation power element such as a Si-IGBT, the temperature coefficient of an element resistance Ron is negative in order to electrically conduct p/n junction. Thus, when the power elements are used in parallel, a current convergence may occur to break down a particular element. Therefore, it has not been considered for the known semiconductor module to allow a large current to flow through the module by operating a plurality of small-area semiconductor elements in parallel as in the semiconductor module of the present invention.

On the other hand, according to a semiconductor device (semiconductor module) of the present invention, even a unipolar element such as a MISFET and a JFET, for example, provides a high breakdown voltage and a sufficiently low on-resistance, and vertical semiconductor elements (segments) can be connected in parallel without the need for special control.

INDUSTRIAL APPLICABILITY

The semiconductor device of the present invention is utilized for semiconductor elements composed of a wide band-gap semiconductor such as silicon carbide (SiC), GaN or diamond, for example, for a device such as a MOSFET, an ACCUFET or a JFET installed in electronic equipment, more particularly, for a power device.

The invention claimed is:

1. A semiconductor device comprising:
   a plurality of semiconductor elements each including an active region made of a wide band-gap semiconductor and at least two electrode pads to which an operating voltage is applied, said plurality of semiconductor elements being operable independently of one another;
   a plurality of electrode terminals;
   a plurality of connection members for electrically connecting each of the electrode pads of each of a plurality of particular semiconductor elements, which are at least some of the plurality of semiconductor elements, to a corresponding one of the plurality of electrode terminals, and
   an isolation region serving as a Schottky diode for electrically isolating the plurality of semiconductor elements from one another,
   wherein said plurality of particular semiconductor elements operate in parallel with one another, and
   the plurality of semiconductor elements are formed on a common substrate, and at least one of the electrode pads of each of the semiconductor elements other than the particular semiconductor elements of the plurality of semiconductor elements is not electrically connected to either of the plurality of electrode terminals.

2. The semiconductor device of claim 1, wherein each of the plurality of connection members is composed of a material that is blown out by the flow of a current exceeding a fixed value.

3. The semiconductor device of claim 2, wherein each of the plurality of connection members is composed of metal.

4. The semiconductor device of claim 1, wherein the semiconductor elements other than the particular semiconductor elements of the plurality of semiconductor elements include those determined as having a malfunction by a test.

5. The semiconductor device of claim 1, wherein the semiconductor elements other than the particular semiconductor elements of the plurality of semiconductor elements include those determined as operating well by the test, and the number of the particular semiconductor elements is set at a fixed value.

6. The semiconductor device of claim 1, wherein the area of each of the semiconductor elements is within the range between 0.1 mm$^2$ and 50 mm$^2$.

7. The semiconductor device of claim 1, wherein the semiconductor elements include at least either MISFETs or Schottky diodes.

8. The semiconductor device of claim 1, wherein the wide band-gap semiconductor is silicon carbide.

9. A semiconductor device comprising:
   a plurality of semiconductor elements each including an active region made of a wide band-gap semiconductor and at least two electrode pads to which an operating voltage is applied, said plurality of semiconductor elements being operable independently of one another;
   a plurality of electrode terminals;

a plurality of connection members for electrically connecting each of the electrode pads of each of a plurality of particular semiconductor elements, which are at least some of the plurality of semiconductor elements, to a corresponding one of the plurality of electrode terminals, and an isolation region serving as a Schottky diode for electrically isolating the plurality of semiconductor elements from one another, wherein said plurality of particular semiconductor elements operate in parallel with one another.

* * * * *